United States Patent
Prasad

(10) Patent No.: US 7,743,350 B2
(45) Date of Patent: Jun. 22, 2010

(54) VERIFYING ONE OR MORE PROPERTIES OF A DESIGN USING SAT-BASED BMC

(75) Inventor: Mukul R. Prasad, Sunnyvale, CA (US)

(73) Assignee: Fujitsu Limited, Kawasaki (JP)

( * ) Notice: Subject to any disclaimer, the term of this patent is extended or adjusted under 35 U.S.C. 154(b) by 911 days.

(21) Appl. No.: 11/119,489

(22) Filed: Apr. 29, 2005

(65) Prior Publication Data

US 2005/0262456 A1 Nov. 24, 2005

Related U.S. Application Data

(60) Provisional application No. 60/573,399, filed on May 21, 2004.

(51) Int. Cl.
 G06F 17/50 (2006.01)
 G06F 9/45 (2006.01)
(52) U.S. Cl. .................. 716/5; 716/2; 703/15
(58) Field of Classification Search ...... 716/2, 716/5; 703/13–15
 See application file for complete search history.

(56) References Cited

U.S. PATENT DOCUMENTS

| | | | | |
|---|---|---|---|---|
| 7,047,139 | B2 * | 5/2006 | Shtrichman | 702/22 |
| 7,346,486 | B2 * | 3/2008 | Ivancic et al. | 703/22 |
| 2003/0225552 | A1 * | 12/2003 | Ganai et al. | 703/2 |
| 2004/0230407 | A1 * | 11/2004 | Gupta et al. | 703/2 |

OTHER PUBLICATIONS

M. K. Ganai, L. Zhang, P. Ashar, and A. Gupta, "Combining strength of circuit-based and CNF-based algorithms for a high performance SAT solver," in Design Automation Conference, 2002, pp. 1-4.*
A. Biere, A. Cimatti, E. M. Clarke, M. Fujita, and Y. Zhu, "Symbolic model checking using SAT procedures instead of BDDs," Proc. of the 36th ACM/IEEE Design Automation Conference, 1999, pp. 317-320.*
Strichman, Tuning SAT Checkers for Bounded Model Checking, Jul. 2000, Springer, Proceedings of the 12th International Conference on Computer Aided Verification (CAV), vol. 1855 of Lecture Notes in Computer Science, pp. 480-494.*
Kim et al., On Solving Stack-Based Incremental Satisfiability Problems, 2000, Proceedings of the 2000 IEEE International Conference on Computer Design: VLSI in Computers & Processors, pp. 379-382.*
Amla et al., Experimental Analysis of Different Techniques for Bounded Model Checking, Proc. of the 9th TACAS, vol. 2619 of LNCS, pp. 34-48, Springer, Apr. 2003, 15 pages.
Bjesse et al., "SAT-Based Verification without State Space Traversal," Proc. of the 3rd Intl. Conf. on Formal Methods in CAD, vol. 1954 of LNCS, pp. 372-389, Springer, Nov. 2000, 18 pages.

(Continued)

Primary Examiner—Paul L Rodriguez
Assistant Examiner—Juan C Ochoa
(74) Attorney, Agent, or Firm—Baker Botts L.L.P.

(57) ABSTRACT

In one embodiment, a method for satisfiability (SAT)-based bounded model checking (BMC) includes isolating information learned from a first iteration of an SAT-based BMC process and applying the isolated information from the first iteration of the SAT-based BMC process to a second iteration of the SAT-based BMC process subsequent to the first iteration.

12 Claims, 2 Drawing Sheets

OTHER PUBLICATIONS

Cabodi et al., Improving SAT-Based Bounded Model Checking by Means of BDD-Based Approximate Traversals, Proc. of the Design Automation and Test in Europe, pp. 898-903, Mar. 2003, 6 pages.

Chauhan et al., "Automated Abstraction Refinement for Model Checking Large State Spaces using SAT based Conflict Analysis," Proc. of the 4th Int. Conf. on Formal Methods in CAD, vol. 2517 of LNCS, pp. 33-51, Nov. 2002, 19 pages.

Clarke et al., "Bounded Model Checking Using Satisfiability Solving," Formal Methods in System Design, pp. 1-20, Jul. 2001, Kluwer Academic Publishers, 20 pages.

Copty et al., "Benefits of Bounded Model Checking in an Industrial Setting," Proc. of the 13th Intl. Conf. on Computer Aided Verification, vol. 2102 of LNCS, pp. 436-453, Springer, Jul. 2001, 18 pages.

Fallah, "Binary Time-Frame Expansion," Proc. of the Intl. Conf. on CAD, pp. 458-464, Nov. 2002, 9 pages.

Ganai et al., "Improved SAT-Based Bounded Reachability Anaylsis," Proc. of the 15th Intl. Conf. on VLSI Design, pp. 729-734, Jan. 2002, 6 pages.

Goldberg et al., "BerkMin: A Fast and Robust Sat-Solver," Proc. of Design Automation and Test in Europe, pp. 142-149, Mar. 2002, 8 pages.

Goldberg, "Using SAT for Combinational Equivalence Checking," Proc. odf Design Automation Test in Europe, pp. 114-121, Mar. 2001, 8 pages.

Gupta et al., "Abstraction and BDDs Complement SAT-Based BMC in DiVer," Proc. of the 15th Conf. on Computer-Aided Verification, vol. 2725 of LNCS, pp. 206-209, Springer, Jul. 2003, 4 pages.

Gupta et al., "Learning from BDDs in SAT-Based Bounded Model Checking," Proc. of the 40th Design Automation Conf., pp. 824-829, Jun. 2003, 6 pages.

Gupta et al., "Iterative Abstraction Using SAT-Based BMC with Proof Analysis," Proc. of the Intl. Conf. on CAD, pp. 416-423, Nov. 2003, 8 pages.

Iyer et al., "SATORI-A Fast Sequential SAT Engine for Circuits," Proc. of the Intl. Conf. on CAD, pp. 320-325, Nov. 2003, 6 pages.

Kuehlmann et al., "Robust Boolean Reasoning for Equivalence Checking and Functional Property Verification," IEEE Trans. on CAD, 21(12):1377-1394, Dec. 2002, 18 pages.

Marques-Silva et al., "GRASP: A Search Algorithm for Propositional Satisfiability," IEEE Trans. on Computers, 48(5):506-521, May 1999, 16 pages.

McMillan, "Symbolic Model Checking: An Approach to the State Explosion Problem," Kluwer Academic Publishers, 1993.

McMillan, "Interpolation and SAT-Based Model Checking," Proc. of the 15th Conf. on Computer-Aided Verification, vol. 2725 of LNCS, Springer, Jul. 2003, pp. 1-13.

McMillan, "Automatic Abstraction Without CounterExamples," Proc. of the 9th TACAS, vol. 2619 of LNCS, Springer, Apr. 2003, pp. 1-17.

Moskewitcz et al, "Chaff: Engineering an Efficient SAT Solver," Proc. of the 38th Design Automation Conf., p. 530-535, Jun. 2001, 6 pages.

Sentovich et al., SIS: A System for Sequential Circuit Synthesis, Technical Report UCB/ERL M92/41, ERL, College of Engg. U.C. Berkeley, May 1998, pp. 1-45.

Shacham et al., "Tuning the VSIDS Decision Heuristic for Bounded Model Checking," Proc. of the 4th Intl. Workshop on Microprocessor Test and Verification, pp. 75-79, May 2003.

Sheeran et al., "Checking Safety Properties Using Induction and a SAT-Solver," Proc. of the 3rd Intl. Conf. on Formal Methods in CAD, vol. 1954 of LNCS, pp. 108-125, Springer, Nov. 2000, 19 pages.

Shtrichman et al, "Accelerating Bounded Model Checking of Safety Formulas," Formal Methods in System Design, 24(1):5-24, Jan. 2004, Kluwer Academic Publishers, pp. 5-24, 20 pages, Jan. 2004.

The VIS Group, "VIS: A System for Verification and Synthesis," Proc. of the 8th Intl. Conf. on Computer Aided Verification, vol. 1102 of LNCS, pp. 428-432, Springer, Jul. 1996, 7 pages.

Whittemore et al., "SATIRE: A New Incremental Satisfiability Engine," Proc. of the 38th Design Automation Conf., pp. 542-545, Jun. 2001, 6 pages.

[http://ee.princeton.edu/~chaff/zchaff.php,]Dec. 2003, 1 page.

Zhang, "SATO: An Efficient Propositional Prover," Proc. of the Intl. Conf. on Automated Deduction, pp. 272-275, Jul. 1997, 5 pages.

Arora et al., "Enhancing SAT-Based Bounded Model Checking Using Sequential Logic Implications," IEEE VLSI Design Conference, pp. 784-787, 4 pages, Jan. 2004.

T.V. Group, "VIS: A System for Verification and Synthesis," Proc. of the 8th International Conference on Computer Aided Verification, vol. 1102, pp. 428-432, New Brunswick, New Jersey, Springer, Jul. 1996, 7 pages.

Bakoglu, "Circuits, Interconnections, and Packaging for VLSI," Addison -Wesley Publishing Company, pp. 541 pages, 1990.

* cited by examiner

VERIFYING ONE OR MORE PROPERTIES OF A DESIGN USING SAT-BASED BMC

RELATED APPLICATION

This application claims the benefit, under 35 U.S.C. §119(e), of U.S. Provisional Application No. 60/573,399, filed May 21, 2004.

TECHNICAL FIELD OF THE INVENTION

This invention relates generally to circuit design and more particularly to for verifying one or more properties of a design using satisfiability (SAT)-based bounded model checking (BMC).

BACKGROUND

Functional verification of digital hardware designs has become an important and resource-intensive aspect of the product design cycle. With the increasing size and complexity of designs, simulation-based validation is no longer sufficient to provide the requisite design coverage needed to expose subtle bugs. Formal verification techniques such as symbolic model checking based on binary decision diagrams offer the potential of exhaustive coverage. However, in practice, their application has been limited by the state explosion problem.

SUMMARY

According to the present invention, disadvantages and problems associated with circuit design may be reduced or eliminated.

In one embodiment, a method for SAT-based BMC includes isolating information learned from a first iteration of an SAT-based BMC process and applying the isolated information from the first iteration of the SAT-based BMC process to a second iteration of the SAT-based BMC process subsequent to the first iteration.

Particular embodiments of the present invention may provide one or more technical advantages. As an example, particular embodiments provide simple, but effective, optimizations that enhance BMC based on Boolean SAT methods. Particular embodiments combine SAT-based inductive reasoning with BMC. Particular embodiments provide orchestration of variable ordering and learned information in an incremental framework in BMC. Particular embodiments provide BMC-specific variable-ordering strategies for SAT solving. Particular embodiments provide pre-processing of the BMC problem based on logic optimization techniques. Particular embodiments significantly reduce time requirements otherwise typically associated with verifying circuit designs. Particular embodiments significantly increase the efficacy of SAT-BMC tools. Particular embodiments may provide all, some, or none of the technical advantages described above. Particular embodiments may provide one or more other technical advantages, one or more of which may be apparent, from the figures, descriptions, and claims herein, to a person having ordinary skill in the art.

BRIEF DESCRIPTION OF THE DRAWINGS

To provide a more complete understanding of the present invention and the features and advantages thereof, reference is made to the following description, taken in conjunction with the accompanying drawings, in which.

DESCRIPTION OF EXAMPLE EMBODIMENTS

Figure 1:
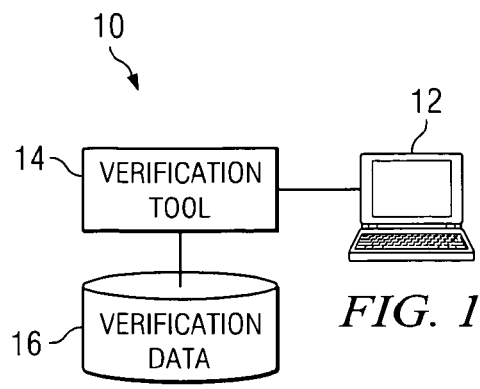
FIG. 1 illustrates an example system 10 for verifying a design.

FIG. 1 illustrates an example system 10 for verifying a design. Reference to a design encompasses a design of a hardware component, such as a digital circuit including multiple digital components, where appropriate. System 10 includes a computer system 12, a verification tool 14, and verification data 16. Computer system 12 may enable a user to provide input to and receive output from verification tool 14. As described below, verification tool 14 may attempt to verify one or more properties of a design. Verification tool 14 may use verification data 16 to attempt the verification. Verification tool 14 may include hardware, software, or both for attempting to verify one or more properties of a design. In particular embodiments of the present invention, verification tool 14 includes a BMC tool, an SAT solver, or both. Although computer system 12, verification tool 14, and verification data 16 are illustrated and described as being more or less separate from each other, the present invention also contemplates two or more of computer system 12, verification tool 14, and verification data 16 being more or less combined with each other. As an example and not by way of limitation, in particular embodiments, verification tool 14 may be a software component of computer system 12 and verification data 16 may be stored at computer system 12.

BMC based on SAT methods is often used to complement BDD-based verification methods. Given a temporal logic property p to be verified on a finite transition system M, the essential idea is to search for counter examples to p in the space of all executions of M whose length is bounded by some integer k. This problem is translated into a Boolean formula satisfiable if and only if a counter example exists for the given value of k. This check is performed by a conventional SAT solver. This process is typically iterated with increasing values of k until a counter example to the property being verified is found or one or more resource constraints are exceeded. Improvements in SAT solver technology have enabled SAT-based BMC to reason about systems well beyond the capacity limit of BDD-based methods.

Particular embodiments of the present invention provide optimization to SAT-BMC implementations. Typically, SAT-solver performance dominates overall runtime resources of an SAT-BMC solver. Particular embodiments of the present invention provide optimization focusing on improving performance of the SAT solver, in the context of the BMC problem, by directly or indirectly influencing the use of learned clauses and variable ordering. Particular embodiments of the present invention do not replace the SAT solver's default ordering scheme, but instead complement the SAT solver's default ordering scheme with useful information derived from the BMC problem in a nonintrusive manner.

Previous incremental satisfiability techniques applied to BMC problems typically provide speedup on the order of only 2× by virtue of incremental reasoning. Particular embodiments of the present invention enhance such previous incremental reasoning techniques to consistently achieve speedups on the order of approximately a magnitude or more. In particular embodiments, orchestration of successive BMC iterations to maximize information shared between iterations and using appropriate variable ordering to enable the SAT solver to effectively exploit the shared information facilitate such speedup.

Previous use of logic optimization as a preprocessing step has been applied in the context of combination equivalence checking (CEC), but the requirements of logic optimization in the case of CEC differ in that the optimizer strives to preserve or enhance the structural similarity between the two descriptions, whereas, in the case of BMC, the purpose is to simplify the circuit in a manner that accelerates SAT-based reasoning on the circuit. Particular embodiments of the present invention are at least somewhat orthogonal to the use of an AND-INVERT graph for maintaining a semi-canonical, compressed circuit representation on which BMC is performed by a circuit-based SAT solver, since the on-the-fly compression algorithm can be applied in addition to the logic optimization technique in particular embodiments of the present invention to derive additional benefits. Further, a preprocessing logic optimization script tends to provide greater power and flexibility than the local optimization capability provided by the on-the-fly compression approach.

BMC based on Boolean SAT methods has become a widely used alternative to BDD-based methods for finding bugs in large designs. Particular embodiments of the present invention provide simple, but effective, optimizations for enhancing performance of SAT-based BMC flows. Particular embodiments combine SAT-based inductive reasoning and BMC, orchestrate variable ordering and learned information in an incremental framework for BMC, make use of BMC-specific ordering strategies for the SAT solver, and provide a pre-processing of the BMC circuit based on logic optimization techniques. Such embodiments may consistently provide between one and two orders of magnitude of speedup over previous techniques and may significantly enhance efficacy of SAT-BMC tools. In particular embodiments of the present invention, performance improvements are achieved by changing the formulation and methodology of BMC, leaving the internal working of the SAT solver largely untouched. This makes the optimizations at least partly independent of the particular SAT solver and useable with newer and better SAT solvers.

BMC runtime may be substantially improved by applying a lightweight single pass of combinational logic optimization to simplify the circuit before performing BMC. This is partly due to the fact that, for model checking RT-level specifications, they need to be synthesized down to logic level where engines such as SAT or BDDs may be applied to them. Verification front-ends typically perform a low cost synthesis which may produce fairly unoptimized logic. Moreover, since an SAT solver operates on a particular representation of a logic function, rather than BDDs, which build and work on a canonical form, the efficiency of SAT-BMC may be significantly influenced by optimizing the logic representation. Particular embodiments of the present invention use a simple script based on fanin "don't care" optimization and constant propagation, which provides a good trade-off between optimization effort and BMC runtime reduction.

Particular embodiments of the present invention maximize relevant shared information between successive iterations and make use of efficacious variable ordering for incremental reasoning in a typical iterative SAT-BMC set-up. Particular embodiments of the present invention symbiotically integrate SAT-based inductive reasoning into SAT-based BMC. In such embodiments, clauses learned during induction may be used to accelerate the SAT search in subsequent BMC iterations. Particular embodiments of the present invention enhance the default variable order of the SAT solver with structural information from BMC without tampering with the internal details of the SAT solver.

In particular embodiments of the present invention, learned information need not be generated by a separate analysis engine, such as one using BDDs. Particular embodiments of the present invention are not limited to improving BMC runs. The SAT-based induction run used in particular embodiments of the present invention may be used to potentially prove the correctness of the property. Such embodiments complement BMC approaches. Particular embodiments of the present invention do not replace an SAT solver's default ordering scheme. Such embodiments instead complement the default ordering scheme with useful information derived from the BMC problem in a non-intrusive manner.

Figure 2:
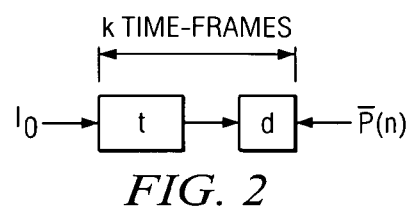
FIG. 2 illustrates an example BMC problem.

By way of example, consider the following SAT-BMC framework. A temporal logic property p is to be verified on a finite transition system M. For simplicity, assume that M has a single initial state $I_0$ and that the property p is an invariant. FIG. 2 illustrates an example BMC problem posed on a k-timeframe unrolled ILA of M. The module $\overline{P}(n)$ is a monitor that checks for the violation of property p in any of the last (rightmost) n time frames. The property p=1 in the first (leftmost) k−n time frames as these time frames would have already been checked for violation of p in earlier BMC iterations. These assertions enhance the efficiency of the BMC. This feature is not explicitly shown in FIG. 2, but may be assumed. The ILA of FIG. 2 is translated into a CNF formula and decided by a conventional SAT solver. This process starts with k=1 and is iterated with increasing values of k until a violation of property p is detected or a user-specified bound on k or some resource constraints are exceeded. In each successive iteration, k is increased by n, i.e., n new time frames are added to the ILA from the current iteration. n is also known as the step size of BMC problem.

Figure 3:
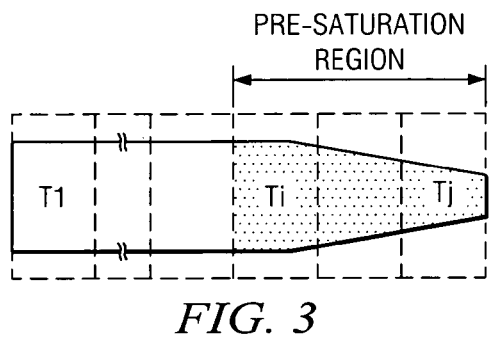
FIG. 3 illustrates an example presaturation region (PSR) for a given bounded cone of influence (BCOI)

Particular embodiments of the present invention use the BCOI reduction. FIG. 3 illustrates an example PSR for a given BCOI. The outer dotted rectangle represents the unrolling of the circuit for j time frames, while each small dotted rectangle represents one time frame of the circuit. The solid polygon shows the reduced circuit based on the BCOI reduction. The shaded region denotes the PSR for the given BCOI. The PSR is the part of the BCOI where the BCOI is growing with each successive time frame, i.e., for time frames of the BCOI outside the PSR, the BCOI and cone of influence (COI) are identical. The depth of the PSR (in terms of number of timeframes it encompasses) is denoted $\delta_{PSR}$. As an example and not by way of limitation, in FIG. 3, $\delta_{PSR}$=j−i+1. Further, d=max(n,$\delta_{PSR}$). Thus, the k-length ILA of FIG. 2 is composed of two parts: (1) an ILA of d time frames encompassing the PSR and the monitor block $\overline{P}(n)$ implemented on the last (rightmost) n of these d time frames; and (2) a tail ILA of the remaining t time frames where t=k−d. The first few iterations of BMC will have no tail block and only a part of the PSR.

The philosophy behind incremental reasoning is relatively simple. When two CNF formulas share many common clauses, it may be possible to pass the knowledge learned during the SAT solution of the first formula to the second one so that the solving of the second formula becomes easier. The learned knowledge is normally expressed in terms of conflict clauses. As an example and not by way of limitation, the following theorem describes incremental reasoning.

THEOREM 1. Let $\phi_1$, $\phi_2$, $\psi$, $\zeta_1$, $\zeta_2$, and $\phi$ be CNF formulas, and let $\phi_1 = \psi \wedge \zeta_1$, $\phi_2 = \psi \wedge \zeta_2$. If solving SAT($\phi_1$) produces the clauses of $\phi$ as conflict clauses such that each clause of $\phi$ is an implicate of $\psi$, then SAT($\phi_2$)≡SAT($\phi_2 \wedge \phi$).

PROOF. Since every clause of $\phi$ is an implicate of $\psi$, $\psi \Rightarrow \phi$. Hence, $\psi \equiv (\psi \wedge \phi)$. Therefore, $(\psi \wedge \zeta_2) \equiv (\psi \wedge \zeta_2 \wedge \phi)$.

Thus, during the process of solving CNF $\phi_1$, if the SAT solver can analyze and gather the conflict clauses derived solely from the common portion of the CNFs, i.e., $\psi$ in the above, then these clauses, $\phi$, can be preemptively added to the CNF $\phi_2$ and may accelerate its subsequent SAT solution. SAT solvers such as SATIRE and zchaff support this form of incremental reasoning.

SAT-BMC problems tend to be ideal for incremental reasoning, since a large portion of such a problem is common between successive BMC iterations. Previous attempts at incremental BMC have met with only moderate success, with speedups limited to approximately 2×. Particular embodiments of the present invention improve on such basic incremental BMC formulations and provide consistent speedups of approximately an order of magnitude or more.

To successfully use incremental SAT in solving two CNFs $\phi_1$ and $\phi_2$, it is necessary to identify a significant common portion, $\psi$, between them. Suppose two successive iterations, $I_j$ and $I_{j+1}$, of the BMC problem are given to be solved on k and k+n length unrollings of the system, respectively. It may appear that the problem of $I_j$ is a proper subset of the problem being solved in iteration $I_{j+1}$. As a result, it may be tempting to mark the entire CNF of iteration $I_j$ as the common portion $\psi$, i.e., transfer all conflict clauses generated while solving $I_j$ to the BMC problem of iteration $I_{j+1}$. However, as described below, this may lead to an incorrect result.

Figure 4:
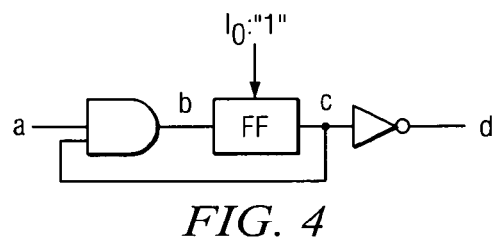
FIG. 4 illustrates an example design.
Figure 5:
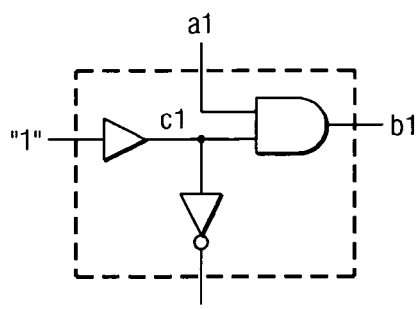
FIG. 5 illustrates an example first iteration of BMC on the design illustrated in FIG. 4.
Figure 6:
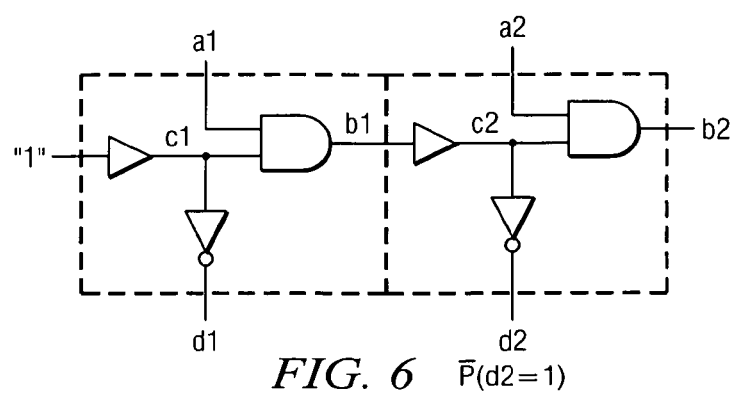
FIG. 6 illustrates an example second iteration of BMC on the design illustrated in FIG. 4.

By way of example, given the circuit illustrated in FIG. 4, assume that the initial value of the flip-flop c is 1 and that the property to be verified is AG(d=0). FIGS. 7 and 8 illustrate first and second iterations of BMC, which check for a counter example in a first and a second time frame, respectively. Apparently, d=0 holds only for the first time frame. In other words, the CNF formula for FIG. 5 should be UNSAT, while the formula for FIG. 6 should be SAT. It is easy to check that it is possible to learn the clause $\overline{c_1}$ as a conflict clause while solving the first iteration of BMC. This clause may be derived from the assertion clause $d_1$. If all learned conflict clauses are carried over directly to the second iteration, the second iteration would be rendered UNSAT by the addition of clause $\overline{c_1}$, which is incorrect.

A fundamental change between two successive BMC iterations is the insertion of a block of n additional time frames. The point of insertion of the new time frames with respect to the ILA of the current iteration (which is illustrated in FIG. 2) may significantly impact the efficacy of the resulting incremental BMC scheme. Essentially, this decision determines what elements of the BMC problem may be included in the shared portion $\psi$ and, therefore, which conflict clauses are transferable to the next iteration.

Figure 7A:
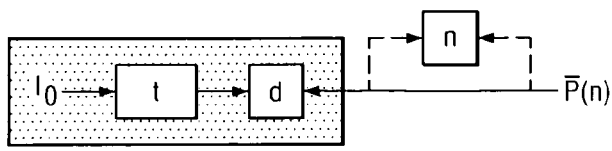
FIGS. 7A-7C illustrate example ways to unroll a circuit for a next iteration.
Figure 7B:
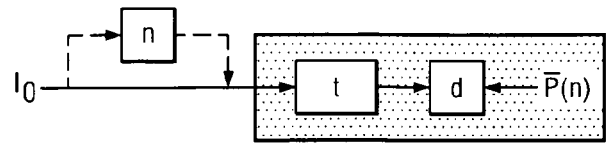
Figure 7C:
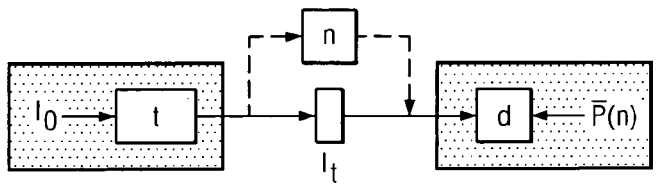
Figure 8:
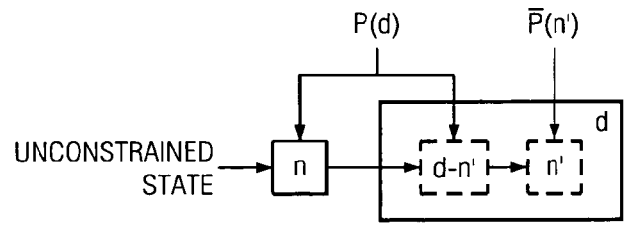
FIG. 8 illustrates an example construction for an induction step.

FIGS. 7A-7C illustrate example ways to unroll the circuit for the next iteration, where a new block of n time frames is inserted into the ILA of FIG. 2. The first option, illustrated in FIG. 7A, is to add the new block to the right of ILA. In the second alternative, illustrated in FIG. 7B, the new block of n frames is added to the left of the current ILA. Lastly, the new time frames can be inserted somewhere in the middle of current ILA. The CNF formula for a typical BMC iteration (illustrated in FIG. 2) has four basic components:

$\phi_{I_0}$: Clauses for asserting the initial state $I_0$.
$\phi_{\overline{P}}$: Clauses for representing the monitor circuit $\overline{P}(n)$.
$\phi_{CL}$: Clauses for the logic gates implementing the functionality of each time frame.
$\phi_{l_i}$: Clauses for the latches $l_i$ of each time frame i which appear as buffers in the unrolled circuit and connect the next state outputs of one time frame to the present-state inputs of a next time frame.

For the right-hand-side insertion scheme illustrated in FIG. 7A, the monitor circuit needs to shifted right, i.e., re-posed on the newly inserted block of n time frames. Therefore, the clauses $\phi_{\overline{P}}$ cannot be included in the shared clauses $\psi$ for incremental BMC. Consequently any conflict clauses derived from the monitor circuit and/or linking the monitor circuit to the internal signals of the ILA cannot be used for incremental BMC in the next iteration. Furthermore, the BCOI reduction will need to be recomputed in each iteration. On the other hand, the left-hand-side insertion scheme illustrated in FIG. 7B necessitates re-posing the initial state clauses on the present state variables of the left most time frame in the newly inserted block. Thus, the clauses $\phi_{I_0}$ cannot be included in the shared set $\psi$ and consequently any conflict clauses expressing the implications of the given initial state on the problem cannot be used in incremental BMC of the next iteration.

Finally, particular embodiments of the present invention, as illustrated in FIG. 7C, insert the new block in the middle of the current ILA, specifically right behind the PSR block. As illustrated in FIG. 7C, the next BMC iteration can be constructed from the current one by simply replacing the latch-buffer clauses $\phi_{l_0}$ which link the PSR block to the tail block with the clauses for the newly added n time frames. The entire shaded portion of FIG. 7C forms the shared portion for incremental BMC of subsequent iterations. Consequently, many useful conflict clauses derived from both $I_0$ and $\overline{P}(n)$ may be transferred to subsequent BMC iterations. Furthermore, since the new block is inserted in the saturated portion of the ILA, the BCOI need not be recomputed in each iteration. Using the above notation, this scheme may be defined as follows:

DEFINITION 1 (MIDDLE INSERTION SCHEME). Given the CNF $\phi_i$ for the BMC problem of the current iteration i, where $\phi_i = \phi_{I_0} \wedge \phi_{\overline{P}} \wedge \phi_{CL} \wedge \wedge_{j=1}^{k} \phi_{1_j}$, $\psi$ can be constructed as $\psi_i = \phi_{I_0} \wedge \phi_{\overline{P}} \wedge \phi_{CL} \wedge \wedge_{\{j:1 \leq j \leq k, j \neq t\}} \phi_{1_j}$. If $\phi$ be the set of conflict clauses derived solely from $\psi$, during the solution of SAT($\phi_i$), then the incremental BMC CNF for iteration i+1 can be constructed as $\phi_i + 1 = \psi \wedge \phi \wedge \phi_{CL_n} \wedge \wedge_{j=k+1}^{k+n} \phi_{1_j}$, where $\phi_{CL_n}$ are clauses for the newly inserted time frames and $\wedge_{j=k+1}^{k+n} \phi_{1_j}$ denote the latch clauses connecting these time frames.

THEOREM 2. The middle insertion scheme of DEFINITION 1 preserves the correctness in incremental BMC.

PROOF. The proof follows directly from applying THEOREM 1, above, to the $\psi$ of DEFINITION 1, as every conflict clause included in iteration i+1 is an implicate of the common CNF formula $\psi$ for both iterations i and i+1.

The BMC problem for the next iteration may indeed be constructed from the previous iteration, as shown in FIG. 7C, i.e., by inserting the new block in place of the latches $l_t$. A significant difference between the three schemes is in the component of the current ILA that is excluded from the common portion $\psi$ for incremental reasoning. For instance, in theory, one may have a right-insertion scheme (FIG. 7C) mimic middle insertion by excluding clauses of latches $l_t$ from $\psi$ and then shifting the conflict clauses in $\phi$, derived from block d, by n time frames to the right. However, closer inspection reveals that this is essentially a more complicated way of realizing the middle insertion scheme. Further, the analysis of what clauses to shift and the shifting itself is not part of the incremental SAT framework available in SAT solvers and would need to be implemented externally.

Particular embodiments of the present invention use a hybrid SAT variable-ordering scheme. It combines an initial order derived from the topology of the BMC circuit (which provides a high level structure to the SAT search) with a conflict driven dynamic variable ordering scheme similar to that used in modem SAT solvers like zchaff and BerkMin. Although equally applicable to nonincremental BMC, it complements other enhancements described herein and is a significant component of overall gains realized through incremental BMC. The variable ordering algorithm and associated performance gains are further described below.

By default, clauses incrementally inherited from previous BMC iterations contribute to the initial variable order just like original clauses of the CNF. This may have some harmful side effects. For example, these clauses could cause the search to be biased toward areas of the problem with higher concentration of inherited conflict clauses and away from the newly added time frames, which do not inherit any conflict clauses from previous time frames. This would disrupt the topology driven structure imposed on the search by our variable ordering scheme. Therefore, in particular embodiments of the present invention, incrementally inherited conflict clauses are not allowed to influence the variable order of the SAT solver. Instead, they are only allowed to participate in search-space pruning. However, future conflict clauses derived from these clauses, during the SAT search, are allowed to contribute to the variable order according to the dynamics of the variable ordering scheme. Incorporation of this relatively simple idea increases the stability and robustness of the BMC flow.

For certain design property combinations, SAT-based inductive reasoning is significantly superior to state-space traversal at proving such property combinations. However, SAT-based inductive reasoning can prove only a very small percentage of properties. For most cases, the induction run proves to be an overhead. Particular embodiments of the present invention make use of an inductive reasoning according to which the SAT-based inductive analysis may be used to prove the property where possible and, in the remaining cases, conflict clauses learned during the induction run may be used to accelerate future iterations of SAT-BMC.

By way of example, suppose previous SAT-BMC iterations have established the absence of a counter-example to the property being verified in the first d time frames from the initial state. FIG. 8 illustrates an example construction for the induction step. Each block is named by the number of time frames it contains. The size of block n is equal to the step size of SAT-BMC, and the size of the block d is $\max(n, \delta_{PSR})$, as described above. Block d may be further decomposed into block n' and block d-n', where block n' contains n timeframes (equal to block n), and block d-n' contains all remaining time frames of block d. The correctness of the property p is asserted on all frames in block n and block d-n'. The counter examples to p are checked on all time frames of block n'. The initial state lines are left open. This construction is decided by a SAT solver. If the SAT solver returns UNSAT, the property may be shown to be inductively true for all depths.

However, if the above run returns SAT (which is usually the case), the learned conflict clauses may be intelligently applied to the subsequent BMC runs. The construction illustrated in FIG. 8 has been made identical to right-hand portion of a typical BMC iteration step—such as that illustrated in FIG. 7C—to facilitate this. Conflict clauses learned during the SAT solution of FIG. 8 may be divided into three parts:

H clauses: clauses that only involve variables in block d.
T clauses: clauses that only involve variables in block n.
HT clauses: clauses that involve variables in both block d and n.

These learned clauses may be applied to subsequent BMC iterations as outlined in the following algorithm:

---

Algorithm for Application of Inductively Learned Clauses

1. Add H clauses once and permanently to the clause database.
2. For each new BMC iteration, clone T clauses to T' and add T' clauses permanently to the clause database.
3. For each new BMC iteration, clone HT clauses to HT' and add HT' clauses temporarily to the clause database.
4. After each iteration terminates, remove HT' clauses as well as any new conflict clauses derived from HT' clauses from the clause database, i.e., HT' clauses or their derivatives are not incrementally carried over to the next iteration.

---

The cloning in step 2, above, conforms to the variable names in the block n in FIG. 7C. This may be implemented by adding a displacement $\delta(i)$ that may be easily computed for each iteration i to each literal in the T clauses. On the other hand, the cloning in step 3, above, may be implemented by adding the $\delta(i)$ only to those literals in the HT clauses that belong to block n. Clauses may be added permanently to the database only if they are guaranteed not to alter the result of all subsequent BMC iterations. Each BMC iteration may derive new clauses from these permanently added clauses. Newly derived clauses may tend to preserve the satisfiability of BMC problem as well. Incremental SAT-BMC in particular embodiments of the present invention automatically transfers all permanent clauses as well as conflict clauses derived from them to subsequent iterations.

The correctness of the above scheme may be established by the following theorems where $\phi_i$ stands for the CNF for the $i^{th}$ iteration of BMC, $n_i$ represents the newly added block in $i^{th}$ iteration, and $\phi_{\overline{P}}$, $\phi_{CL}$, and $\phi_{1_j}$ are defined as described above.

THEOREM 3. It is sound to add H clauses permanently to the BMC clause database.

PROOF OF THEOREM 3. The CNF for the block d can be constructed as $\psi = \phi\ CL(d) \wedge \phi\overline{p}$. Because for any i, $\psi \subset \phi_i$, and because H is derived sole from $\psi$, it follows that for all i, $SAT(\phi_i \wedge H) \equiv SAT(\phi_i)$.

THEOREM 4. It is sound for each BMC iteration to add T' clauses permanently to the clause database.

PROOF OF THEOREM 4. For each BMC iteration, i, $n_i$ is structurally identical to block n in FIG. 8. Since T clauses are solely derived from $\phi_{CL(n_i)}$, T' clauses are solely derivable from $\phi_{CL(n_i)}$ as well. Since $\phi_{CL(n_i)} \subset \phi_i$ for any $j \geq i$, it follows then that for any $j \geq i$, $SAT(\phi_j) \equiv SAT(\phi_j \wedge \phi_{CL(n_i)}) \equiv SAT(\phi_j \wedge T')$.

THEOREM 5. It is sound for each iteration to add HT' clauses to the clause database. However, HT' clauses should be removed upon the completion of current iteration.

PROOF OF THEOREM 5. The CNF for the block nd, the merger of block n and block d in FIG. 8, may be expressed as $\psi = \phi_{CL(n)} \wedge \phi_{CL(d)} \wedge \phi_{I_{nd}} \wedge \phi_{P(n)} \wedge \phi_{P(d-n')} \wedge \phi_{\overline{P}(n')}$. For each BMC iteration i, the CNF for the block $n_i$d, the merger of the block $n_i$ and the block d, may be expressed as $\psi_{n_i} = \phi_{CL(n_i)} \wedge \phi_{CL(d)} \wedge \phi_{I_{n_id}} \wedge \phi_{P(d-n')} \wedge \phi_{\overline{P}(n')}$. Because the block $n_i$d and the block nd are structurally identical and because HT clauses are solely derived on $\psi$, HT' clauses should be solely derivable from $\psi_{n_i}$. Since $\psi_{n_i} \subset \phi_i$, the following may be derived: $SAT(\phi_i) \equiv SAT(\phi_i \wedge \psi_{n_i} \wedge HT') \equiv SAT(\phi_i \wedge HT')$. However, since $\phi_{I_{n_id}} \not\subset \psi_{i+1}$, then $\psi_{n_i} \not\subseteq \psi_{i+1}$. Thus the following may be true $SAT(\phi_{i+1}) \neq SAT(\phi_{i+1} \wedge \psi_{n_i}) \equiv SAT(\phi_{i+1} \wedge HT')$.

Similar to the scenario described above, the conflict clauses learned from the induction-based reasoning may not be allowed to influence the variable order of the SAT solver. Instead, they only contribute to search-space pruning. While the incremental formulation described above does not contribute any learned clauses to the newly added block n (illustrated in FIG. 7C) the above induction-based learning scheme contributes learned information both for the block n (T' clauses) as well as its interaction with adjoining time frames (HT' clauses). Thus, it complements and bolsters the incremental learning described above.

Variable ordering is a significant determinant of the performance of an SAT solver. Often, domain-specific knowledge may be used to enhance the SAT solver's performance for a given application. In particular embodiments of the present invention, since the SAT-BMC framework uses a CNF-based SAT solver, the default ordering heuristics used in modern SAT solvers (such as the VSIDS heuristic of zchaff) are improved by using domain specific knowledge from the BMC problem.

| Algorithm for Generic Hybrid Variable Ordering |
| --- |
| 1. Compute initial variable scores using Metric 1. |
| 2. Sort variables by scores and break ties using Criterion 2. |
| 3. At each conflict increment scores of variables involved in the conflict. |
| 4. Periodically decay all scores and update variable order. |

The above algorithm for generic hybrid variable ordering is a generic setup for realizing a variety of variable ordering schemes that combine the default conflict driven variable ordering used in modern SAT solvers like zchaff and BerkMin with a minimal amount of external information, possibly derived from the problem domain. For example, a fully static, topological order may be realized by removing steps 3 and 4, choosing Metric 1 in step 1 to assign the same score to all variables and setting Criterion 2 to prioritize variables based on a topological order. In contrast, the default order that would be followed by a solver like zchaff would be to set Metric 1 to assign an initial score to each variable equal to the number of clauses it appears in and Criterion 2 would break ties based on the variable number that was assigned to each variable during CNF generation. Different schemes may be realized by different choices for Metric 1 and Criterion 2. Fully static schemes, including those custom-generated for a BMC problem, are surpassed by the default conflict-driven ordering heuristics of modern SAT solvers. In addition, in the scheme of the above algorithm for generic hybrid variable ordering, the choice of the initial order and variable scores (steps 1 and 2) may have a significant impact on the performance of the SAT solver.

This is because, even though the conflict driven dynamic variable ordering of the SAT solver (steps 3 and 4) is free to alter the initial order, in practice, such changes are gradual and usually not dramatic. Therefore, the initial order determines the high-level structure of the search tree, and hence the efficiency of the SAT search. Specifically, an example scheme that tends to work well may be realized by the following choices in Algorithm 2:

Metric 1: Initial score for each variable equal to the number of clauses it appears in, in the BMC CNF.

Criterion 2: Break ties by prioritizing variables based on a topological ordering of them from primary inputs toward the property monitor in the unrolled BMC circuit.

As described above, the default ordering scheme of the SAT solver (such as zchaff) is to use the same choice of Metric 1 as above, but to break ties (Criterion 2) based on the variable numbers assigned to variables during CNF generation. While this may differ from one BMC implementation to another, a typical method is to generate the BMC CNF by traversing and unrolling the circuit backward from the property monitor toward the primary inputs, since this yields the BCOI as a by product).

Variants of the above algorithm for generic hybrid variable ordering, including a slight variation on the default scheme above, where the ties were broken randomly in Criterion 2, is both unpredictable and performs significantly worse than the default scheme. Another variant, where Metric 1 in step 1 assigns the same score to all variables and Criterion 2 prioritizes variables based on a topological ordering based on the BMC circuit, essentially sets the initial variable order to a pure topological order, i.e., inputs to outputs or the reverse. This scheme is also significantly worse than both particular embodiments of the present invention and the default scheme.

Having the initial order as a purely topological (such as the last scheme described above) is usually worse than the "two-step" scheme followed in particular embodiments of the present invention, as well as the default order, which prioritizes assignment to high-weight variables across time frames. Particular embodiments of the present invention that essentially make assignments from inputs to outputs generally performs better than the default scheme which assigns from outputs to inputs. The latter is more akin to the justification-based ordering schemes that have worked well for circuit-based SAT solvers. A possible reason for this is that the default scheme is at best a semistatic justification scheme, which could be fairly poor at "guessing" the right assignments to justify and hence nearly not as effective as various dynamic justification algorithms. Particular embodiments of the present invention may speed up BMC approximately a magnitude or more, particular with respect to UNSAT cases.

Figure 9:
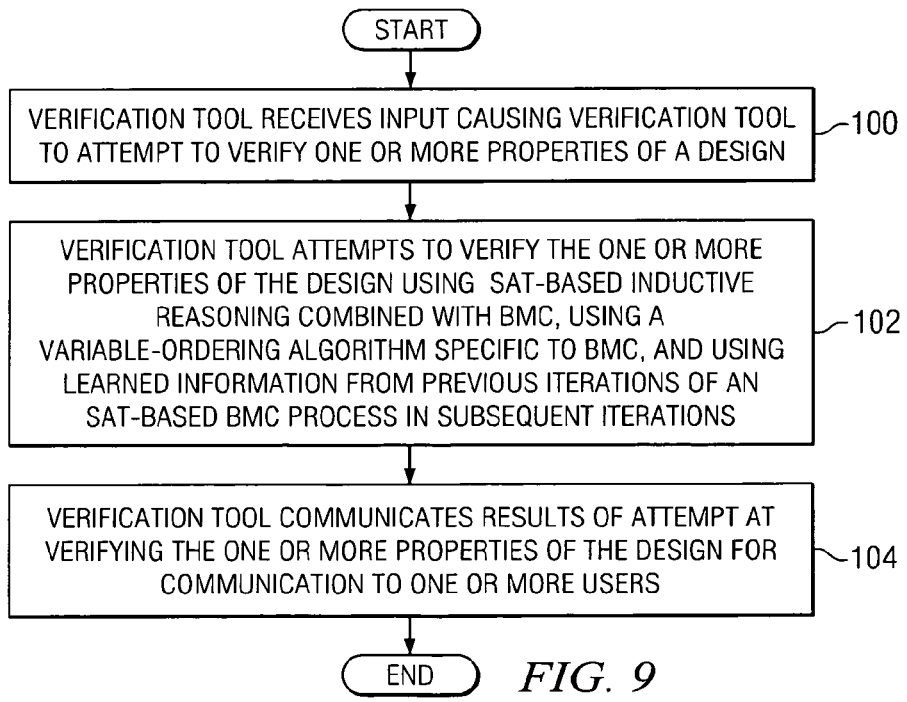
FIG. 9 illustrates an example method for verifying one or more properties of a design using SAT-based BMC.

FIG. 9 illustrates an example method for verifying one or more properties of a design using SAT-based BMC. The method begins at step 100, where verification tool 14 receives input causing verification tool 14 to attempt to verify one or more properties of a design. At step 102, verification tool 14 attempts to verify the one or more properties of the design using SAT-based inductive reasoning combined with BMC, using a variable-ordering algorithm specific to BMC, and using learned information from previous iterations of an SAT-based BMC process in subsequent iterations, as described above. Although verification tool 14 is illustrated and described as using SAT-based inductive reasoning combined with BMC, using a variable-ordering algorithm specific to BMC, and using learned information from previous iterations of an SAT-based BMC process in subsequent iterations, the present invention contemplates verification module 14 using one or more of SAT-based inductive reasoning combined with BMC, a variable-ordering algorithm specific to BMC, and learned information from previous iterations of an SAT-based BMC process in subsequent iterations, as described above, to attempt to verify the one or more properties of the design. At step 104, verification tool 14 communicates results of the attempt at verifying the one or more properties of the design for communication to one or more users, at which point the method ends. Although particular steps of the method illustrated in FIG. 9 have been illustrated and described as occurring in a particular order, the present invention contemplates any suitable steps of the method illustrated in FIG. 9 occurring in any suitable order.

One or more modifications to the present invention may be apparent to a person having ordinary skill in the art, and the present invention encompasses all such modifications that are within the scope of the appended claims. Statements in the specification that are not reflected in the appended claims do not limit the present invention.

What is claimed is:

1. Logic for circuit verification, the logic encoded in one or more media for execution using one or more processors and when executed operable to:
   - access a logic-level description of a circuit generated from a register transfer (RI)-level description of the circuit;
   - apply logic optimization to the logic-level description to simplify the logic-level description for satisfiability (SAT)-based bounded model checking (BMC) of the circuit using the logic-level description to generate a simplified logic-level description;
   - verify the circuit by (i) performing a first iteration of a SAT-based BMC process on the simplified logic-level description; (ii) isolating information learned from the first iteration of the SAT-based BMC process; and (iii) applying the isolated information from the first iteration of the SAT-based BMC to a second iteration of the SAT-based BMC process subsequent to the first iteration; and
   - communicate the results of the circuit verification to a user.

2. The logic of claim 1, further operable to determine a variable order for an iteration of a process of the SAT-based BMC of the simplified logic-level description according to a variable-ordering algorithm specific to BMC.

3. The logic of claim 1, wherein the logic optimization comprises combinational logic optimization.

4. The logic of claim 1, wherein the logic optimization comprises "don't care" optimization.

5. The logic of claim 1, wherein the SAT-based BMC of the simplified logic-level description comprises use of a conjunctive normal form (CNF) solver.

6. The logic of claim 5, wherein the CNF-based SAT solver is a zchaff solver or a BerkMin solver.

7. The logic of claim 1, executable independent of an SAT solver.

8. Logic for circuit design verification, the logic encoded in one or more media for execution using one or more processors and when executed operable to:
   - receive the design of a circuit;
   - determine a variable order for an iteration of a satisfiability (SAT)-based bounded model checking (BMC) process according to a variable-ordering algorithm specific to BMC;
   - verify the circuit design by: (i) performing a first iteration of the SAT-based BMC process on the circuit design; (ii) isolating information learned from a the first iteration of the SAT-based BMC process; and (iii) applying the isolated information from the first iteration of the SAT-based BMC process to a second iteration of the SAT-based BMC process subsequent to the first iteration; and
   - communicating the results of the circuit verification to a user.

9. The logic of claim 8, wherein the information learned from the first iteration comprises one or more conflict clauses generated during the first iteration.

10. The logic of claim 8, wherein:
    - the SAT-based BMC process comprises bounded cone of influence (BCOI) reduction; and
    - the second iteration uses a BCOI from the first iteration.

11. The logic of claim 8, wherein the SAT-based BMC comprises one or more topological searches using one or more unrolled iterative logic arrays (ILAs).

12. The logic of claim 8, carried out independent of an SAT solver.

* * * * *